United States Patent [19]

Opeka

[11] Patent Number: 5,426,567

[45] Date of Patent: Jun. 20, 1995

[54] ELECTRONIC MODULE PACKAGE AND MOUNTING HAVING DIAGONALLY DISPOSED GUIDE PINS AND THREADED RODS

[75] Inventor: Thomas A. Opeka, Bolingbrook, Ill.

[73] Assignee: General Motors Corporation, Detroit, Mich.

[21] Appl. No.: 138,364

[22] Filed: Oct. 15, 1993

[51] Int. Cl.⁶ .............................................. H05K 7/14
[52] U.S. Cl. .................................. 361/740; 361/736; 361/752; 439/362
[58] Field of Search ......................... 312/265; 248/906; 439/359, 362, 365, 378; D13/162, 164; 361/686, 728–736, 740, 752, 785, 788, 796, 801, 803, 826, 827, 829; 211/41

[56] References Cited

U.S. PATENT DOCUMENTS

| | | | |
|---|---|---|---|
| 2,748,321 | 5/1956 | Kamm | 361/733 |
| 3,177,404 | 4/1965 | Patmore | 361/730 X |
| 3,506,877 | 4/1970 | Owen | 361/736 X |
| 3,662,224 | 5/1972 | Rauch | 211/41 X |
| 4,215,386 | 7/1980 | Prager et al. | 361/686 |
| 4,399,487 | 8/1983 | Neumann | 361/730 X |
| 4,716,497 | 12/1987 | Craker | 361/740 |
| 4,811,165 | 5/1989 | Currier et al. | 361/736 X |
| 4,935,695 | 6/1990 | Hayes et al. | 324/758 |
| 5,043,847 | 8/1991 | Deinhardt et al. | 361/736 |
| 5,079,430 | 12/1991 | Meusel et al. | 361/785 X |
| 5,157,590 | 10/1992 | Barthel et al. | 361/730 X |

Primary Examiner—Michael W. Phillips
Attorney, Agent, or Firm—Charles K. Veenstra

[57] ABSTRACT

Similar electronic module packages are provided having guide pins and front actuated retaining rods for mounting the package on a mounting panel having threaded mounting holes spaced in a regular pattern to accept the guide pins and retaining rods of several module packages. The guide pins and retaining rods are mounted on diagonally opposite corners of the modules. Front mounting of the modules and front location of electrical connectors avoids a requirement for rear access to the mounting panel. Various arrangements of modules on the mounting panel are allowed by suitable arrangement of the pattern of mounting holes in the panel. The modules include a housing with a face plate and a mounting plate. The housings include either a support panel or a cover. The face plate and the mounting plate extend above and below the support panel or the cover.

16 Claims, 9 Drawing Sheets

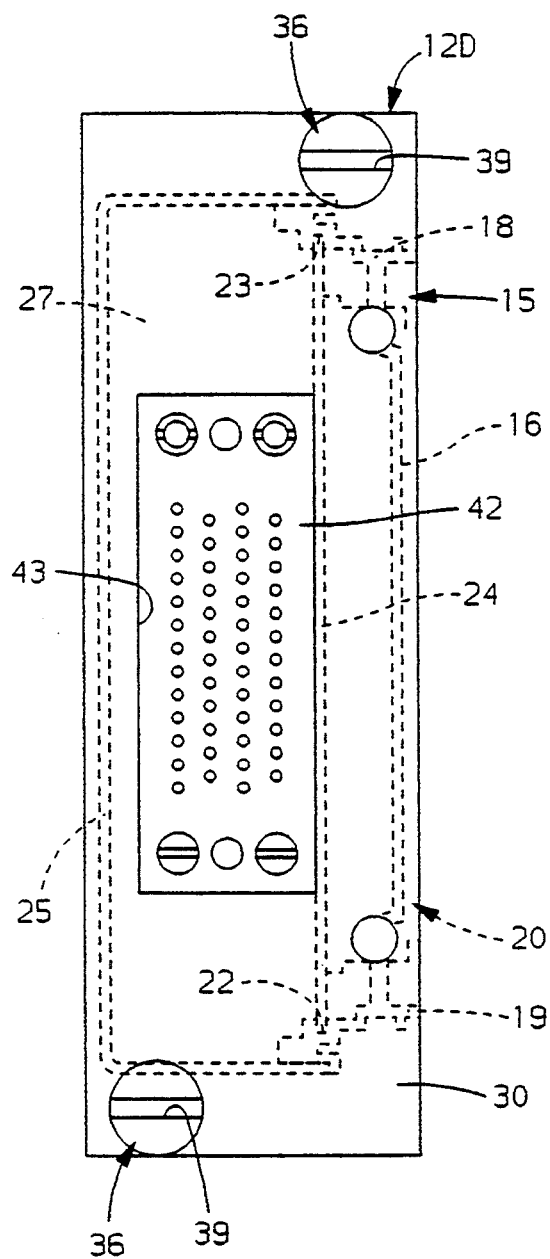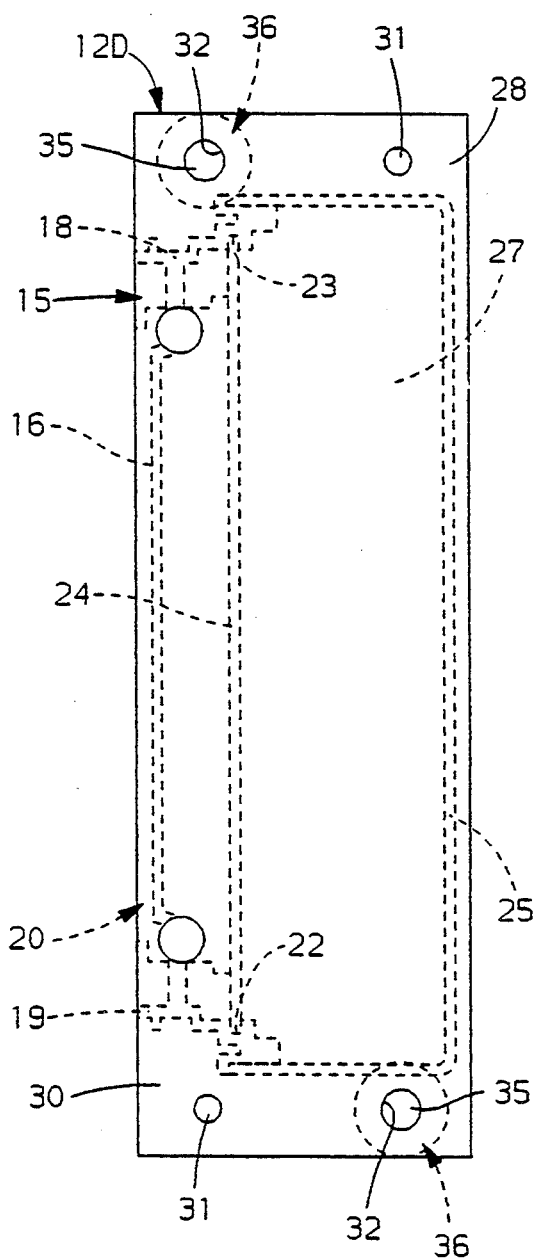
FIG. 6
FIG. 7

ELECTRONIC MODULE PACKAGE AND MOUNTING HAVING DIAGONALLY DISPOSED GUIDE PINS AND THREADED RODS

TECHNICAL FIELD

This invention relates to electronic module packages such as for circuit boards and associated components and to the mounting of such packages on a mounting panel.

BACKGROUND

It is known in the art relating to electronic module packages to provide a variety of package arrangements, connector means and mounting means. Among the prior art are a standardized circuit board support panel formed as an aluminum extrusion and an associated cover. These are available in standard "EURO-RACK" sizes designed to receive a 100 mm. circuit board with a 160 mm. depth.

SUMMARY OF THE INVENTION

The present invention involves a rear panel mounted and front connected module concept providing a flexible packaging system for electronic products such as are used in a rugged environment such as a diesel-electric railway locomotive. The invention combines some of the features of prior modules with additional features and a flexible mounting panel to provide rugged yet simple package and mounting means with easy access for mounting and testing or replacement combined with a family of related module package arrangements. In a preferred embodiment for mounting multiple modules, the height and depth of the modules are fixed and the width is variable in increments related to the spacing of equally spaced threaded mounting holes on a preformed mounting panel.

Among the advantages of the generalized mounting and packaging arrangements of the invention are:

A rear mounting panel may have horizontal and/or vertical rows of equally spaced threaded (or fastener receiving) holes capable of receiving either guide pins or fasteners (e.g. threaded jack screws).

Similar modules are secured to the rear panel by front extending manually tightened jack screws (or other fasteners) without tools (tool engagement is provided for loosening screws if needed).

Common 50 point pin and socket type connector is front mounted on each module and has built in test points for checking the circuits. The connectors may be keyed to prevent cross wiring.

With standardized modules and panel hole spacing, mounting space for the modules can be allocated without details of the internal circuit design. External wiring harness design can then be completed prior to completion of each module circuit arrangement.

Wiring flexibility for special orders is provided by module substitution or addition.

Total enclosure of the circuit electronics and electromagnetic interference (EMI) tight packaging can be provided.

By vertically and horizontally extending the panel hole patterns on standard centers the module packages can be varied in width and height in standardized increments.

With both front mounting and connector location, rear access to the mounting panel is not required.

These and other features and advantages of the invention will be more fully understood from the following description of certain specific embodiments of the invention taken together with the accompanying drawings.

BRIEF DRAWING DESCRIPTION

In the drawings:

FIG. 4–7 are side, top, and front and rear end views of an exemplary embodiment of electronic module package according to the invention;

DETAILED DESCRIPTION

Figure 1:
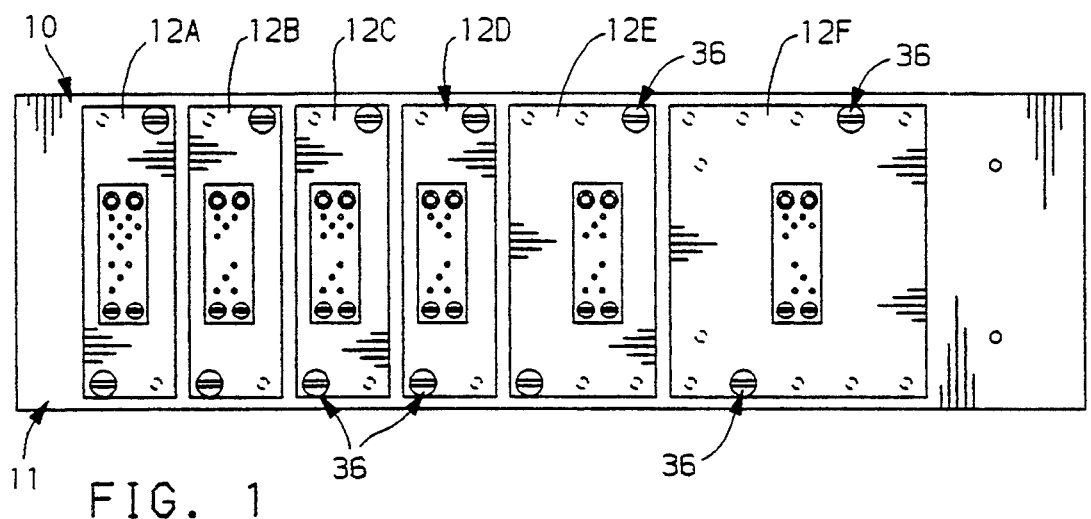
FIG. 1 is a front view showing one embodiment of panel mounting assembly having a plurality of modules according to the invention.
Figure 2:
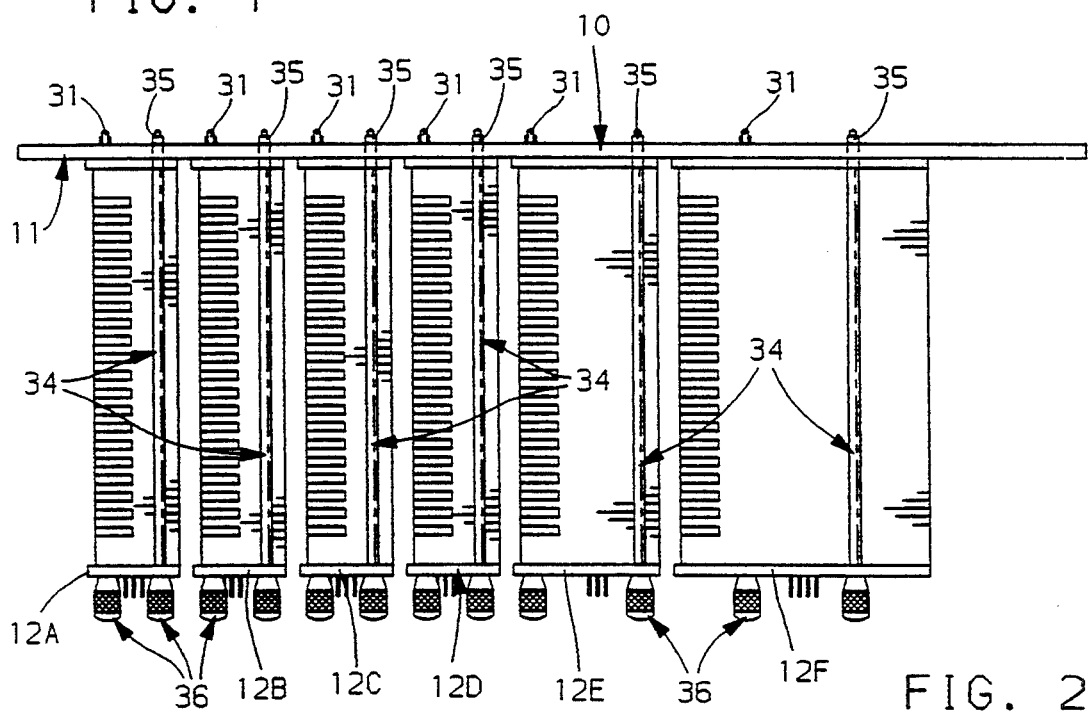
FIG. 2 is a top view of the assembly.

Referring now to the drawings in detail, numeral 10 (FIGS. 1 and 2) generally indicates a panel mounting assembly mounted in an electrical control cabinet or other suitable location, not shown. Assembly 10 includes a mounting panel 11 to which are secured a plurality of electronic modules or module packages 12A, 12B, 12C, 12D, 12E, 12F having certain characteristics in common.

Figure 3:
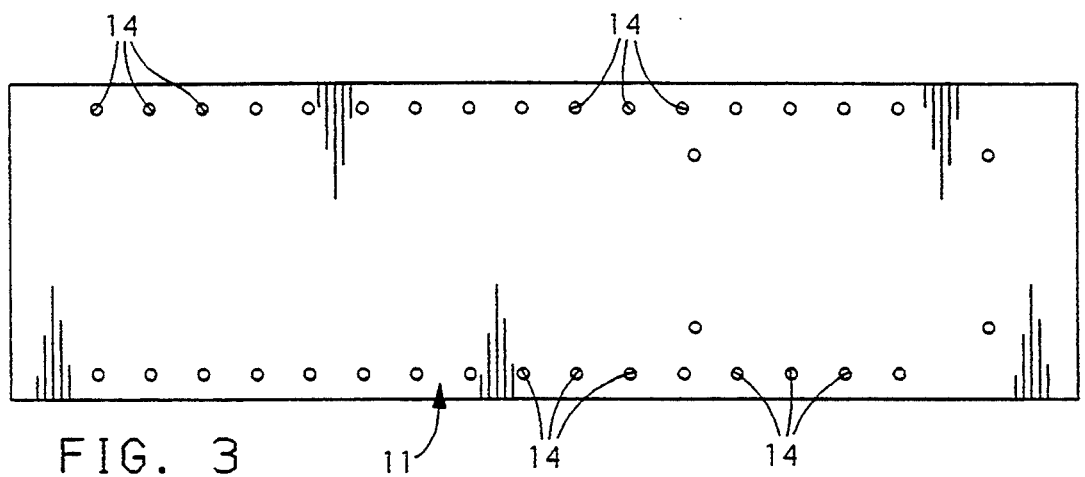
FIG. 3 is a front view of a mounting panel for use in the assembly of FIG. 1.
Figure 4:
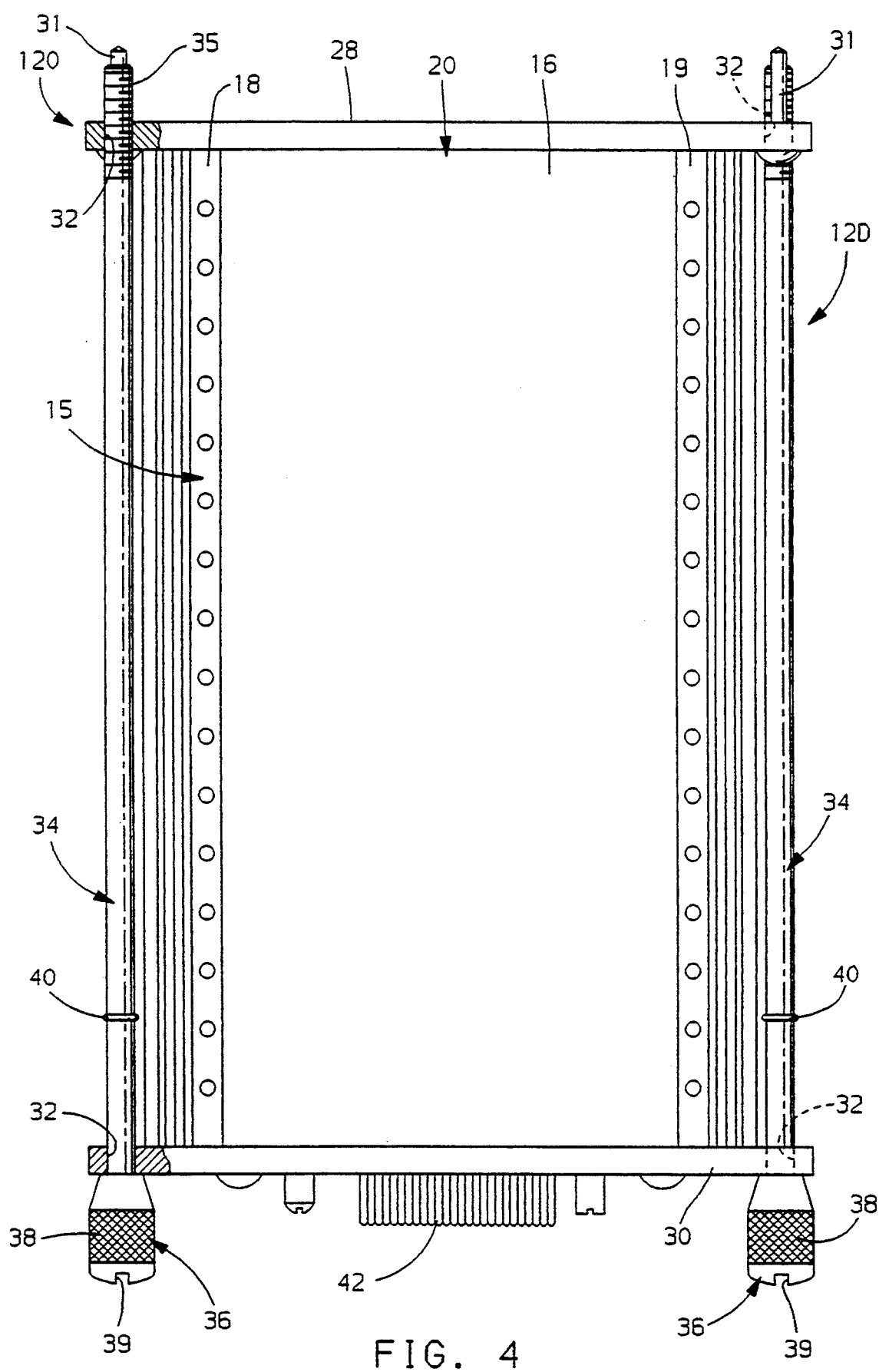
Figure 5:
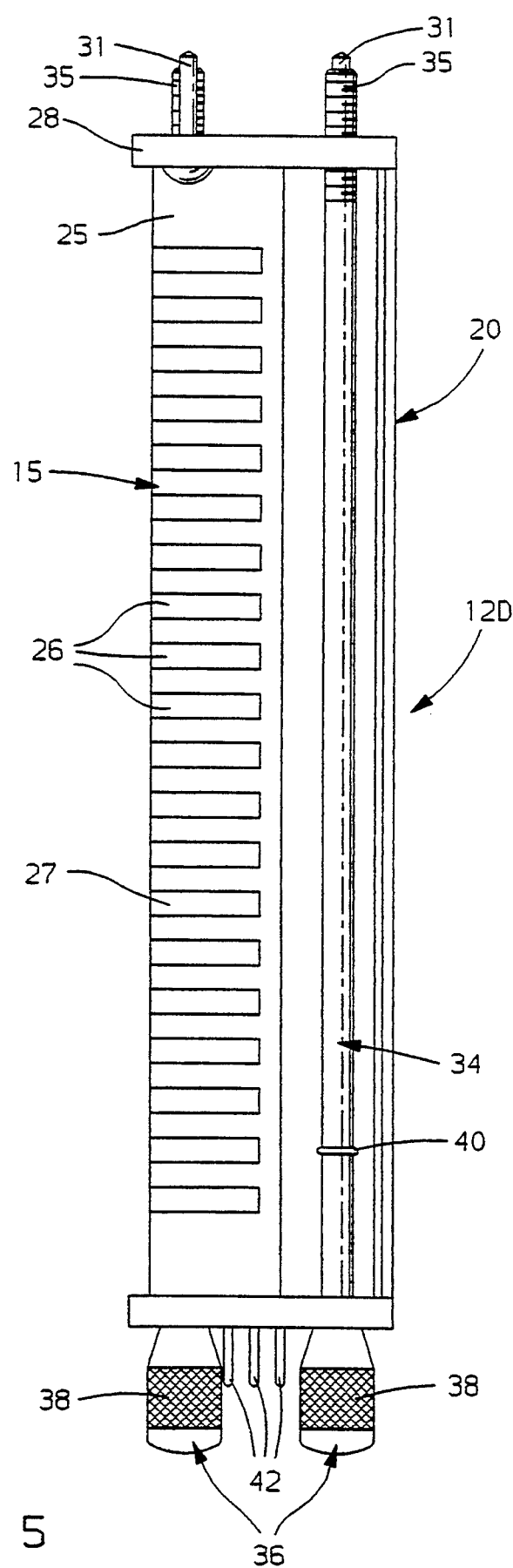

The mounting panel 11 (FIG. 3) includes a plurality of threaded mounting holes 14 which are arranged in a prescribed pattern. The selected pattern as shown has two vertically spaced rows of holes 14 equally spaced horizontally to give flexibility of width for the modules mounted thereon.

If it is desired to give maximum flexibility for the size and shape of module packages and other possible items to be mounted thereon, a panel may be provided with other hole patterns. For example, the holes may be equally spaced vertically and horizontally, allowing variation in both width and height, as well as depth, of the modules to be mounted thereon. However, panel 11 is arranged for the modules to be horizontally aligned as in FIG. 1. Alternatively, the vertical and horizontal spacing and/or hole configuration may be varied as desired to suit a particular module mounting arrangement so as to minimize unnecessary hole or thread forming in manufacture of the panels.

An exemplary module package 12D, as shown in FIGS. 4–7 comprises a housing 15 including a side plate 16 having integrally formed upper 18 and lower 19 support members. The integral plate 16 and members 18, 19 form a support panel in the form of a side panel 20 made, preferably, from a commercially available aluminum extrusion. If desired, a side plate and support members could be separately formed and secured together. The side panel 20 has opposed channels 22, 23 for receiving and supporting a printed circuit board (PCB) 24.

A formed sheet metal cover 25 with corner ventilation slots 26 is secured to the support members 18, 19 of the side panel 20 to define an enclosure 27 adjacent the side panel in which the PCB is supported. At a rear end of the package 12D a rectangular mounting plate 28 is attached to the support members 18,19 of the side panel and cover assembly. A rectangular face plate 30 is similarly attached to the support members at the opposite front end of the assembly. The mounting and face plates have equal widths and equal heights, the widths being slightly greater than that of the side panel and cover assembly while the heights (vertical dimensions) extend beyond the upper and lower portions of the assembly.

A pair of guide pins 31 are fixed to and extend rearward from the mounting plate adjacent diagonally opposite corners at the upper and lower edges. In the other pair of diagonally opposite corners of both the mounting plate and the face plate, aligned openings 32 are provided. A pair of spaced jack screws or retaining rods 34 extend through these openings. The rods 34 have screw threads 35 on their rear ends which extend through the mounting plate 28, and knobs 36 on their front ends outwardly adjacent the face plate. The knobs are knurled at 38 for manual rotation of the retaining rods and also preferably have screwdriver slots 39 or other tool receiving means for tool assisted rotation. Rings 40 carried in grooves on the retaining rods 34 spaced from the knobs on the opposite side of the face plate limit the outward motion of the rods 34 and prevent their withdrawal from the mounting plate openings 32. The retaining rods or jack screws are thus captured as part of the module package 12.

Figure 8:
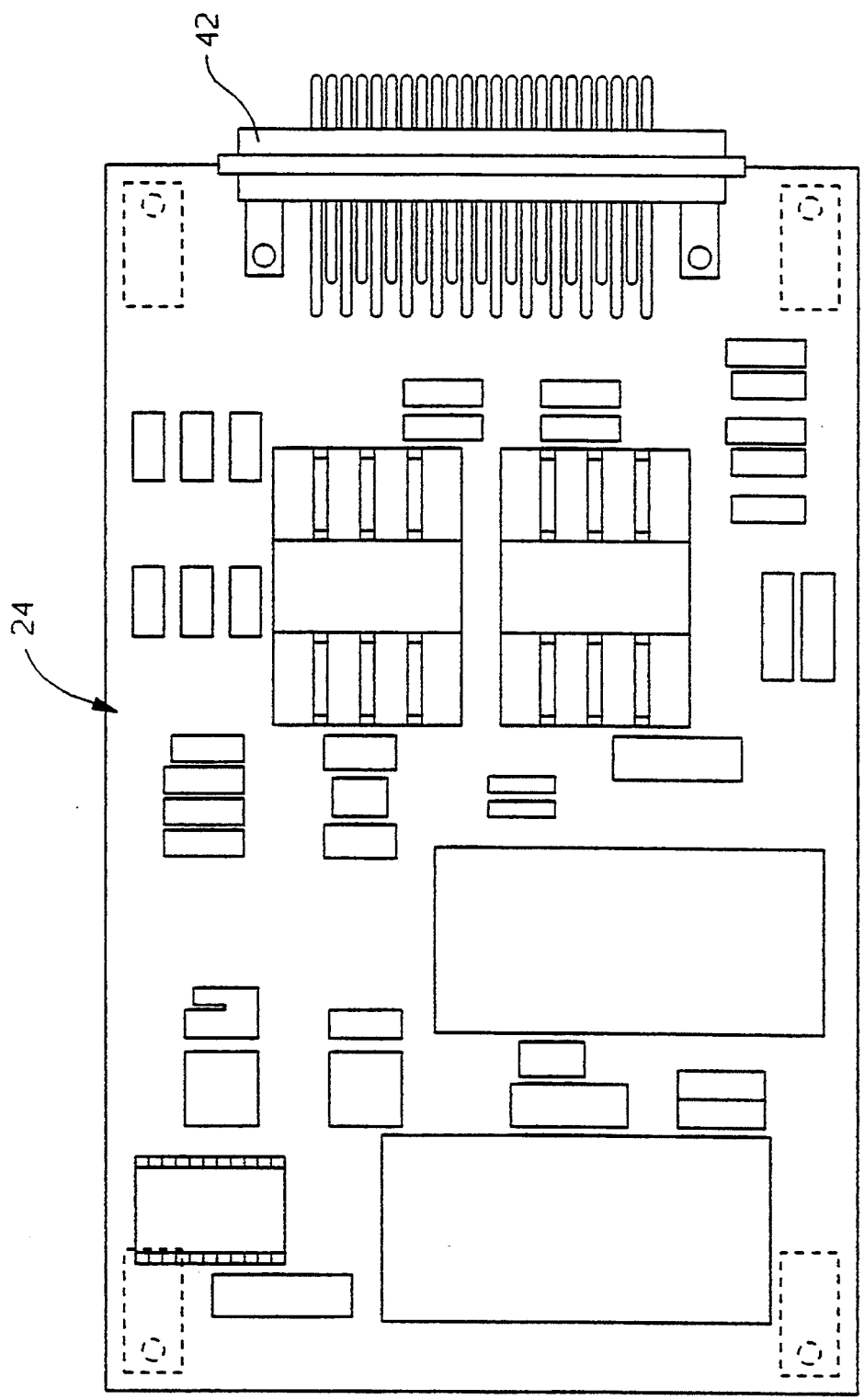
FIG. 8 is a component-side view of a printed circuit board for mounting in the module package.

As shown in FIG. 8, the printed circuit board (PCB) 24 is conventionally arranged with any suitable combination of circuits and components for carrying out an electronic action or function. All external electrical connections terminate at the front edge of the PCB 24 where they are connected with the various pins of a standard 50 pin male electrical connector 42. The connector is mounted on the front edge of the PCB 24 so that, as installed in the module package 12, the connector pins extend out the front of the module through a rectangular opening 43 in the face plate 30.

Figure 9:
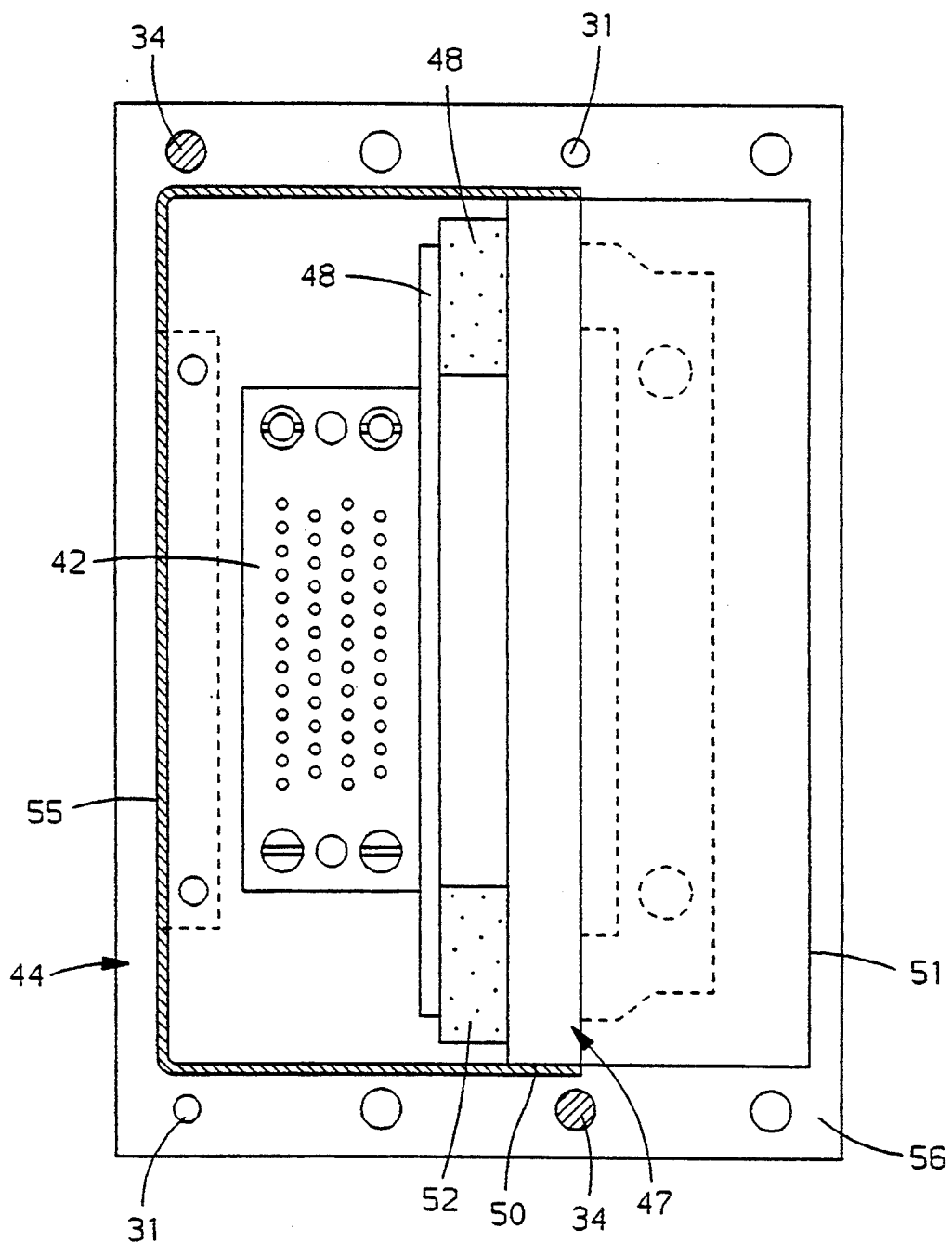
FIGS. 9 and 10 are cross-sectional front and bottom views of a wider alternative module package.
Figure 10:
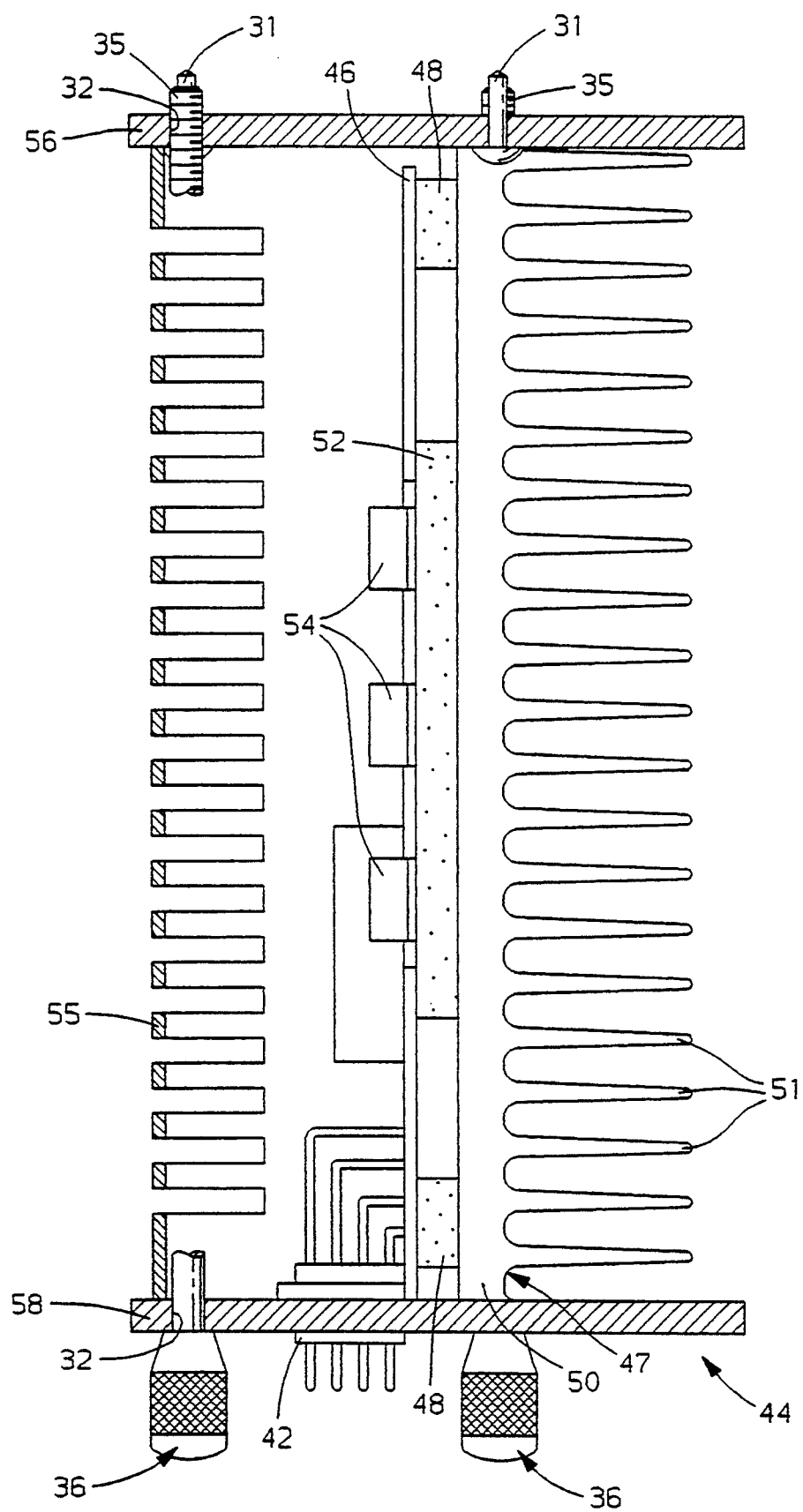

FIGS. 9 and 10 illustrate an alternative form of module 44 in which a circuit board (PCB) 46 is supported on an aluminum heat sink 47 by standoff mounts 48 at the corners. The heat sink includes a solid heat transmitting base 50 to which the PCB 46 is mounted and vertical fins 51 extending sideward from the base in the direction opposite from the PCB. A heat transmitting bar 52 is also carried near the lower edge of the base 50 and carries three heat producing electronic elements 54. A modified slotted cover 55 is mounted on the upper and lower edges of the heat sink base 50 to form a housing enclosing the PCB 46. Heat developed in the elements 54 is conducted through the bar 52 and base 50 for dissipation through the fins 51 in an uncovered side of the module.

A mounting plate 56 and a face plate 58 are, respectively, mounted to the rear and front of the heat sink base 50 which acts as a support panel. The plates 56, 58 are of height equal to those of the first module embodiment of FIGS. 4–8 but have a width greater by twice the horizontal spacing of two adjacent mounting holes 14 in the mounting panel 11. Guide pins 31 and retaining rods 34 extend through openings of the mounting plate 56 which are adjacent the side of the cover 55 and the base 50 which accept the compressive mounting forces. The fin side extensions of the plates 56, 58 are unsupported. When mounted in a mounting panel 11, the module 44 is secured in holes 14 spaced two intervals apart and extends laterally on the fin side beyond a third interval. A connector 42 is front located between the base 50 and the side of cover 55.

Figure 11:
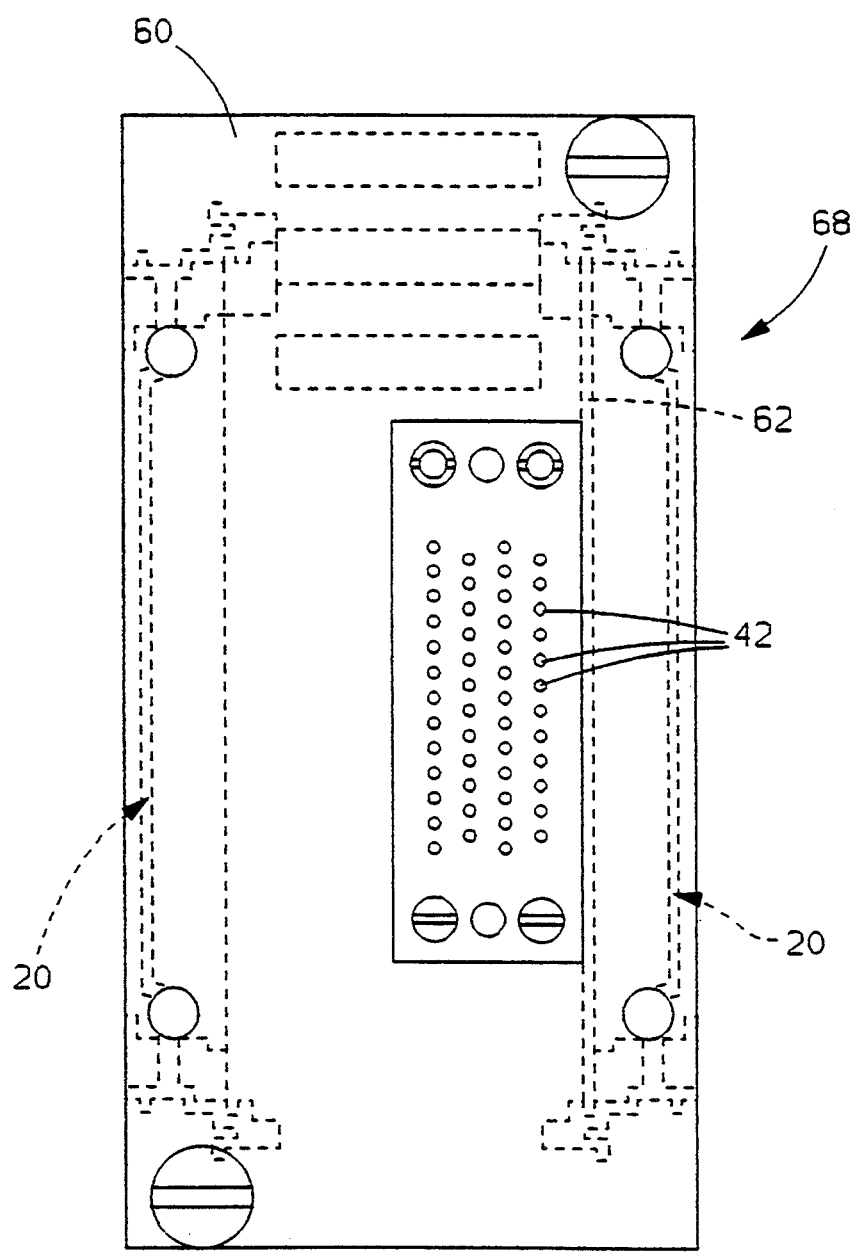
FIGS. 11 and 12 are front and side views of an intermediate width alternative module package.
Figure 12:
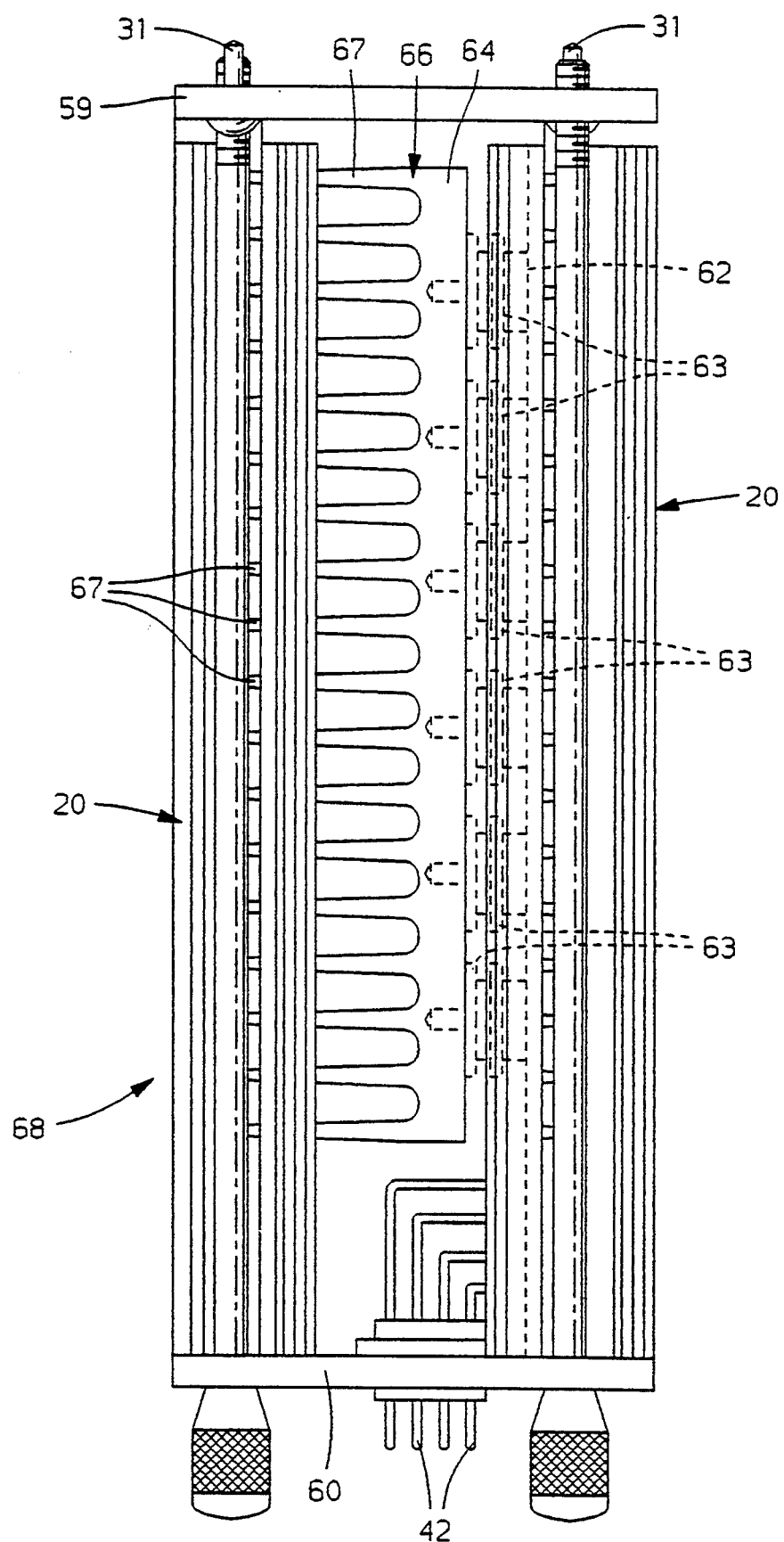

FIGS. 11 and 12 illustrate another example of alternative module embodiment. In this embodiment, the housing is formed by two spaced conventional side panels 20, which act as support panels and the ends of which are attached to a rear mounting plate 59 and a front face plate 60. A single circuit board (PCB) 62 is mounted in one of the side panels 20 and carries several heat producing elements 63 interconnected with other elements, not shown. The elements 63 are connected with the base 64 of a heat sink 66 having vertical fins 67 extending laterally between the side panels 20. The top and bottom of the module package 68 are open to permit air flow to cool the fins. A conventional connector 42 extends through the face plate 60.

The module 68 has a width between those of the previously described embodiments and is mounted to a mounting panel 11 with guide pins 31 and retaining rods 34 at the corners of the mounting panel 11 spaced at double intervals of the panel 11 hole spacing.

In use, a plurality of electronic module packages such as 12A-12F, 44, 68 may be mounted on the mounting panel 11 at spaced locations determined by the spacing of the mounting holes 14 and the sizes of the modules. The horizontal and vertical spacing of the guide pins and retaining rods of each module must, of course match or be a multiple of the spacing of the corresponding rows of holes 14 in the panel. The modules are installed by first inserting the guide pins 31 in corresponding mounting holes 14 to position each module and then manually inserting and tightening the jack screws or retaining rods 34 in the adjacent diagonally positioned holes 14 of the mounting panel. The front mounted connector pins are then connected with female connectors, not shown, provided for example on the wiring harness of an associated electrical cabinet, not shown.

Testing of a malfunctioning PCB 24 may be accomplished in place by connecting a test device to the front mounted connector 42 or the module may be easily removed for testing and repair and another module may be inserted in its place. While manual loosening of the retaining rods 34 is intended, the tool receiving means (slots 39) allow additional torque to be applied for loosening overtightened or stuck retaining rods upon module removal. If desired, for a suitable application, the retaining rods and mounting panels could provide for other forms of fastening means (such as bayonet type) instead of the screw threads illustrated.

While the invention has been described by reference to certain preferred embodiments, it should be understood that numerous changes could be made within the spirit and scope of the inventive concepts described. Accordingly it is intended that the invention not be limited to the disclosed embodiments, but that it have the full scope permitted by the language of the following claims.

What is claimed is:
1. An electronic module package comprising
   a housing including a side plate having opposite edges,
   a pair of spaced support members secured to said opposite edges of the side plate,
   cover means secured to the support members and defining an enclosure adjacent the side plate.
   a mounting plate fixed to the support members at a rear end of the housing, a face plate fixed to the support members at a front end of the housing, the mounting plate and the face plate extending above and below the cover means, a pair of guide pins fixed to and extending rearward from the mounting plate adjacent opposite corners thereof for locating the package on an associated mounting panel, a pair of spaced retaining rods extending through both the face plate and the mounting plate adjacent other opposite corners thereof for securing the package to such panel.

2. An electronic module package as in claim 1 wherein each retaining rod has actuating means on a front end accessible from an external front side of the face plate and securing means on a rear end adjacent to the mounting plate.

3. An electronic module package as in claim 2 wherein each retaining rod is a jackscrew, the securing means comprise a screw thread and the actuating means is a knob.

4. An electronic module package as in claim 3 wherein the knob includes means adapted for hand tightening and removal and also includes tool receiving means for removal when overtightened.

5. An electronic module package as in claim 4 wherein the jackscrew includes retaining means preventing unintentional removal of the jackscrew from the face and mounting plates.

6. An electronic module package as in claim 1 wherein the retaining rods include retaining means preventing unintentional removal of the retaining rods from the face and mounting plates.

7. An electronic module package as in claim 6 wherein the retaining rods are jackscrews having knobs on front ends externally adjacent the face plates and screw threads on rear ends adjacent the mounting plates, the knobs having both manual and tool engaging means.

8. A panel mounting assembly as in claim 1 and further including front mounted electrical connector means on each of the selected packages.

9. A panel mounting assembly as in claim 8 wherein the connector means extends through an opening in the face plate.

10. A panel mounting assembly comprising a mounting panel having a plurality of regularly spaced openings, a plurality of electronic module packages mounted on said panel, at least selected ones of said packages each including, a housing including a support panel having opposite edges and enclosure means at least partially laterally spaced from the support panel, a mounting plate fixed to the support panel at a rear end of the housing, the mounting plate having upper and lower edges, a face plate fixed to the support panel at a front end of the housing, the face plate having upper and lower edges the upper and lower edges of the mounting plate and the face plate extending above and below the support panel, a pair of guide pins fixed to and extending rearward from the mounting plate adjacent the upper and lower edges thereof and locating the package on the mounting panel, a pair of spaced retaining rods extending through both the face plate and the mounting plate adjacent the upper and lower edges thereof for securing the package to said panel.

11. A panel mounting assembly as in claim 10 and further including front mounted electrical connector means on each of the selected packages.

12. A panel mounting assembly as in claim 11 wherein the connector means extends through an opening in the face plate.

13. A panel mounting assembly as in claim 10 wherein the enclosure means comprises a cover secured to the support panel.

14. A panel mounting assembly as in claim 10 wherein the enclosure means comprises a second support panel laterally spaced from the first named support panel and defining a partial housing enclosure therebetween.

15. A panel mounting assembly as in claim 10 wherein said retaining rods extend through diagonally spaced locations of the face and mounting plates adjacent laterally spaced portions of the housing.

16. A panel mounting assembly as in claim 15 wherein the upper and lower edges of the face and mounting plates terminate in rectangularly spaced corners, the guide pins are fixed to the mounting plate at diagonally opposite corners thereof, and the retaining rods extend through other diagonally opposite corners of the face and mounting plates.

* * * * *